United States Patent [19]

Hastings et al.

[11] Patent Number: 5,285,108
[45] Date of Patent: Feb. 8, 1994

[54] COOLING SYSTEM FOR INTEGRATED CIRCUITS

[75] Inventors: Robert J. Hastings; Carl E. Davis, both of Houston, Tex.

[73] Assignee: Compaq Computer Corporation, Houston, Tex.

[21] Appl. No.: 933,881

[22] Filed: Aug. 21, 1992

Related U.S. Application Data

[63] Continuation of Ser. No. 719,249, Jun. 21, 1991, abandoned.

[51] Int. Cl.⁵ ............................................. F28F 7/00
[52] U.S. Cl. ..................... 257/712; 257/717; 257/706; 257/796; 257/787; 257/725
[58] Field of Search ........................ 357/81, 74, 72; 257/704, 706, 707, 712, 717, 719, 796

[56] References Cited

U.S. PATENT DOCUMENTS

| | | | |
|---|---|---|---|
| 4,748,538 | 5/1988 | Tsuji | 351/81 |
| 4,899,208 | 2/1990 | Dietsch et al. | 351/80 |
| 4,926,242 | 5/1990 | Itoh et al. | 351/81 |
| 4,943,844 | 7/1990 | Oscilowski et al. | 351/81 |
| 5,006,921 | 4/1991 | Ishizuka et al. | |
| 5,006,923 | 4/1991 | Warren | 357/80 |
| 5,006,924 | 4/1991 | Frankeny et al. | 357/82 |
| 5,006,925 | 4/1991 | Bregman et al. | 357/82 |
| 5,010,386 | 4/1991 | Groover, III | 357/42 |
| 5,010,389 | 4/1991 | Gansuage et al. | |
| 5,010,390 | 4/1991 | Tanaka | |
| 5,012,324 | 4/1991 | martin et al. | 357/81 |
| 5,012,325 | 4/1991 | Mansuria e tal. | 357/81 |
| 5,014,112 | 5/1991 | Gelsomini | |
| 5,014,113 | 5/1991 | Casto | |
| 5,014,161 | 5/1991 | Lee et al. | 361/388 |
| 5,016,084 | 5/1991 | Nakao | |
| 5,168,926 | 12/1992 | Watson et al. | 257/712 |

FOREIGN PATENT DOCUMENTS

| | | |
|---|---|---|
| 60-7155 | 1/1985 | Japan |
| 60-18942 | 1/1985 | Japan |
| 63-289847 | 1/1988 | Japan |

OTHER PUBLICATIONS

Arnold, et al., "Two-Stage Module Seal", IBM TDB, vol. 21, No. 2, Jul. 1978, pp. 611–612.
"Thermally-Enhanced Tape Automated Bonded Package", IBM TDB, vol. 31, No. 5, Oct., 1988, pp. 34–35.
"Cho-Therm® Thermal Interface Materials," Chomerics, Inc.

Primary Examiner—Eugene R. LaRoche
Assistant Examiner—Viet Q. Nguyen
Attorney, Agent, or Firm—Pravel, Hewitt, Kimball & Krieger

[57] ABSTRACT

A cooling member for an integrated circuit, the member having a recess therein for receiving the integrated circuit and contacting a portion of exterior surfaces of the integrated circuit and a portion of metal leads extending from the integrated circuit; in one aspect, such a member with a plurality of such recesses for accommodating a plurality of such integrated circuits; and in one aspect, such a system including a metal heat sink.

10 Claims, 2 Drawing Sheets

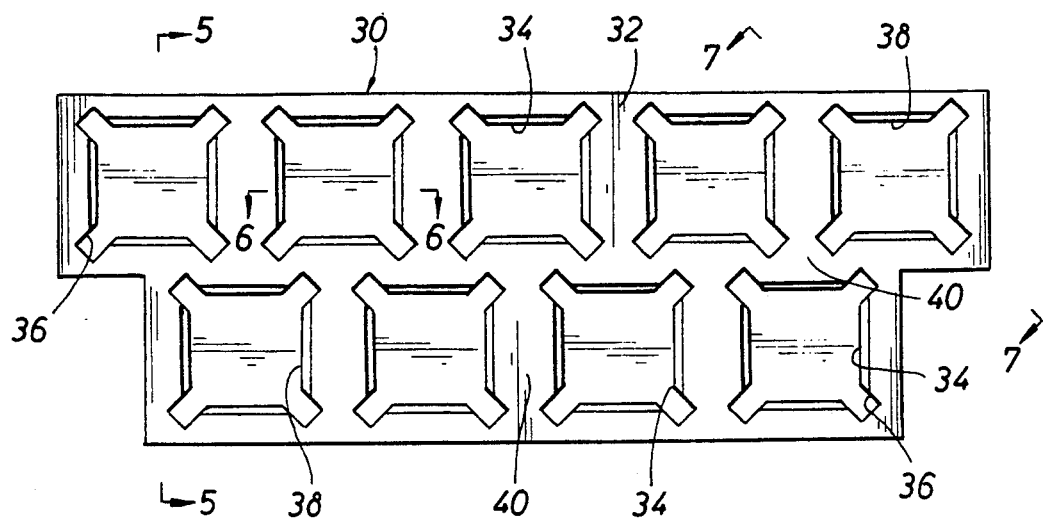
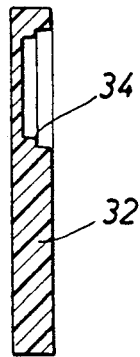
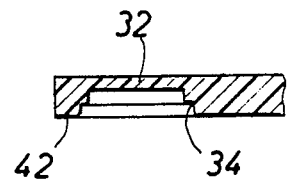
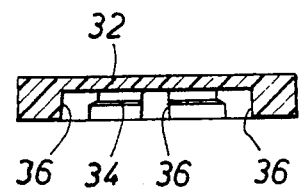
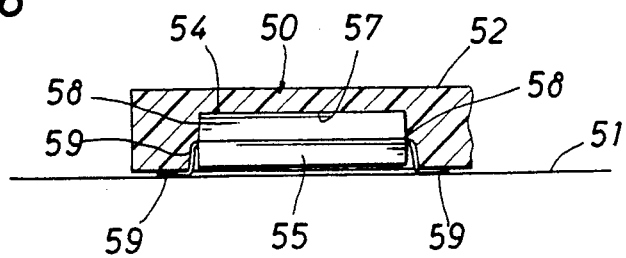

COOLING SYSTEM FOR INTEGRATED CIRCUITS

This is a continuation of co-pending application Ser. No. 719,249 filed on Jun. 21, 1991, abandoned.

BACKGROUND OF THE INVENTION

1. Field Of The Invention

This invention relates in general to the field of cooling integrated circuits and, in particular, to the field of providing a system for conducting heat away from the body and leads of integrated circuits.

2. Description Of Related Art

Efforts at the thermal management of electronic devices are old and well known, as are the adverse effects of excessive temperatures on the performance and integrity of such devices.

Early attempts to control and dissipate heat generated by or around electronic devices included air ventilation apparatuses such as fans to pull ambient air into and exhaust it from a cabinet or chassis containing heat-generating electronic devices. A variety of passive cooling techniques have more recently been employed with semiconductor devices to dissipate heat produced by them. These techniques have included: mica pads; silicone grease; the use of mechanical heat sinks with cooling fins; such heat sinks with a bag of thermally conductive fluid; thermoelectrically cooled devices; ceramic-slab metal-plate composite heat sinks; and thermally conductive elastomeric blankets, to name a few.

Thermal interface materials for removing heat from electronic devices are described in "CHO-THERM ® Thermal Interface Materials," Chomerics, Inc. These products include either a silicone or urethane elastomer binder with boron nitride, magnesium oxide or aluminum oxide as a thermally conductive filler and a reinforcement made from fiberglass cloth or a polyimide or polyester film. These products are electrically non-conductive. In one prior art method of thermal management of heat produced by an integrated circuit, the heat flows from the integrated circuit to a blanket of a thermally conductive elastomer disposed on the integrated circuit and then to a mechanical finned metal heat sink disposed on the blanket.

U.S. Pat. No. 5,006,924 discloses a heat sink for use with high density integrated circuit substrates which includes a compliant bag containing thermally conductive fluid disposed adjacent a typical finned heat sink. The bags rest on the tops of the integrated circuits. A pump may be utilized to circulate fluid through a plurality of interconnected bags.

U.S. Pat. No. 5,012,324 discloses a heat sink body for use with electronic power components which has a ceramic slab covered on both sides with metal plates.

U.S. Pat. No. 5,012,325 discloses a thermoelectrically cooled integrated circuit package.

U.S. Pat. No. 5,006,925 discloses a three-dimensional electronic chip package with a plurality of semiconductor device substrates and a cooling channel through the package for circulation of a cooling fluid therethrough.

U.S. Pat. No. 5,014,161 discloses an elastomeric matrix with conductive elements embedded therein which contact conductive contact pads which in turn contact semiconductor devices.

U.S. Pat. No. 5,010,386 discloses an insulator-separated vertical complementary semiconductor device having an insulating layer.

U.S. Pat. No. 5,006,923 discloses a substrate for mounting integrated circuits in which a non-conductive sealing glass frit covers the integrated circuits.

Although each of the prior art techniques result in some heat transfer from the protected electronic devices, it is desirable to increase the amount of heat transferred from integrated circuits (and to increase the rate of this transfer). It is also desirable to accomplish this in an effective manner which does not substantially increase the overall size of apparatuses employing integrated circuits. Finally, it is desirable to accomplish this with relatively simple materials which are readily available and easy to work with.

SUMMARY OF THE PRESENT INVENTION

The present invention is directed to a system for cooling one or more integrated circuits and for conducting heat from them. In one embodiment, a system is disclosed for a plurality of integrated circuits disposed on a printed circuit board. In this embodiment, a blanket of a thermally conductive interface material (e.g. commercially available CHOTHERM THERM ® (TM) material which is electrically non-conductive) is fashioned with a recess for each integrated circuit. The recesses are configured to correspond to and contact: the top surface of the integrated circuit body; the sides thereof including non-uniform surfaces; and any protrusions or extensions of the body. In a preferred embodiment, the recesses are designed so that thermally conductive material contacts metal leads extending from the integrated circuits, most preferably contacting the leads along a substantial portion of their length and along a substantial part of the portions of the leads that are on a board support. With non-straight contoured leads it is preferred that the blanket be fashioned to follow the lead contour.

The blanket is, in one embodiment, flexible so that it can easily be applied over and about a plurality of integrated circuits which are already affixed to a board or other substrate.

A typical conventional prior art mechanical finned metal heat sink may be applied, in one embodiment of a system according to this invention, to a top surface of a thermally conductive blanket for further heat dissipation. In another embodiment, a second blanket of thermally conductive material may be disposed beneath and in contact with the printed circuit board on the side opposite the side on which the integrated circuits are mounted. Such a second blanket provides further insulation and heat conductance and also serves as a spacer for spacing apart the circuit board from another member, e.g. a computer chassis.

The present invention addresses the need for effective thermal management of integrated circuits and provides a satisfactory meeting of that need in its various embodiments. To one of skill in this art who has the benefits of this invention's teachings and disclosures, advantages of the invention will be clear, as well as others inherent therein, from the following description of presently-preferred embodiments, given for the purpose of disclosure, when taken in conjunction with the accompanying drawings. Although these descriptions are detailed to insure adequacy and aid understanding, this is not intended to prejudice that purpose of a patent which is to claim an invention no matter how others may later disguise it by variations in form or additions of further improvements.

DESCRIPTION OF THE DRAWINGS

So that the manner in which the above-recited features, advantages and objects of the invention, as well as others which will become clear, are attained and can be understood in detail, more particular description of the invention briefly summarized above may be had by reference to certain embodiments thereof which are illustrated in the appended drawings, which drawings form a part of this specification. It is to be noted, however, that the drawings illustrate preferred embodiments of the invention and are therefore not to be considered limiting of its scope as defined in the appended claims, for the invention may admit to other equally effective equivalent embodiments.

FIG. 4 is a bottom view of an insulating blanket according to the present invention.

FIG. 5 is a side cross-sectional view along line 5—5 of the blanket of FIG. 4.

FIG. 6 is a cross-sectional view along line 6—6 of the blanket of FIG. 4.

FIG. 7 is a side cross-sectional view along line 7—7 of FIG. 4.

FIG. 8 is a side cross-sectional view of an insulation system according to the present invention.

DESCRIPTION OF EMBODIMENTS PREFERRED AT THE TIME OF FILING FOR THIS PATENT

Figure 1:
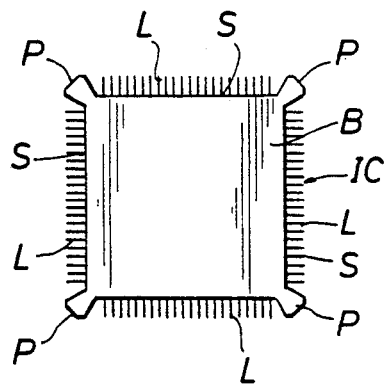
FIG. 1 is a top view of a typical integrated circuit.
Figure 2:
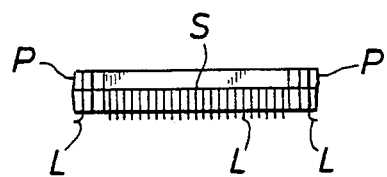
FIG. 2 is an end view of the integrated circuit of FIG. 1.

Referring now to FIGS. 1 and 2, a typical commercially available integrated circuit, IC, has a body B with side walls S, projections P and a plurality of leads L extending from within the body B. An item as shown in FIGS. 1 and 2 is commonly referred to as a "package," specifically a "plastic quad flat pack" or "PQFP." A PQFP and other commonly available package types (for example "DIPS" or "dual in line packages" and "SOICS" or "small outline integrated circuits") may be used with the present invention.

Figure 3:
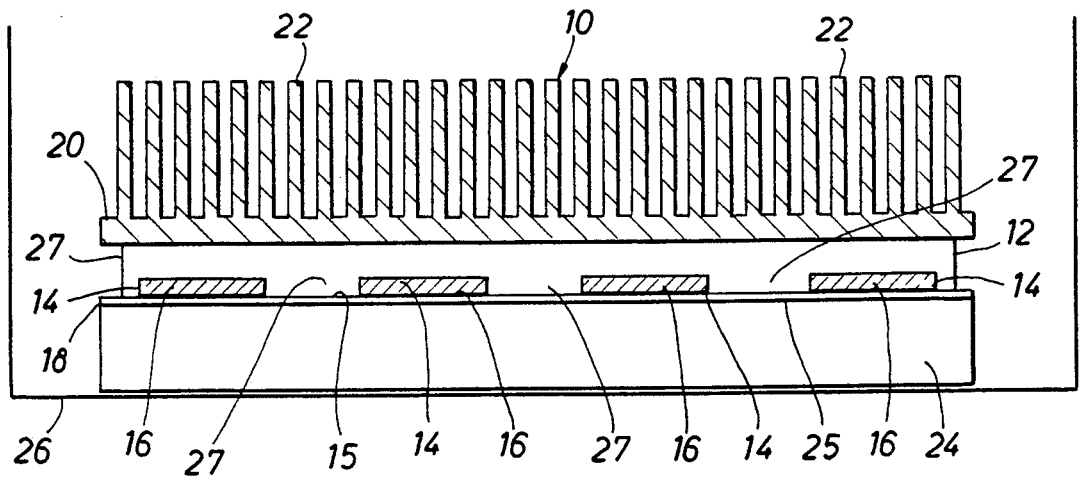
FIG. 3 is a side view in cross-section of a system according to the present invention.

As shown in FIG. 3, a system 10 according to the present invention has a first insulating member 12 made preferably from flexible thermally conductive interface material. The member 12 has a plurality of recesses 14, each configured to receive and partially envelop an integrated circuit 16 mounted on a printed circuit board 18. It is preferred that the member 12 contact substantially all of the top surface and side surfaces of the integrated circuits 16, as well as a substantial portion of metal leads (not shown) which exit from the integrated circuits.

A metal heat sink 20 with a plurality of fins 22 is disposed on top of the member 12. A second insulating member 24 is disposed beneath and in contact with the printed circuit board 18. The second insulating member 24 also serves to maintain the printed circuit board 18 spaced-apart from a chassis 26 of a device, e.g. a computer (or a mounting plate within the chassis). In one embodiment, a bottom 15 of the member 12 and a top 25 of the member 24 are fashioned to correspond in shape to the surfaces of the board 18 with which they are in contact to insulate the board and circuits thereon as well as to conduct heat therefrom.

FIGS. 4-7 illustrate a thermal management member 30 according to the present invention. The member 30 has a main body 32 formed in one embodiment of flexible, electrically non-conductive, thermally conductive material, e.g. CHO-THERM ® (TM) material. A plurality of recesses 34 are provided in the body 32 for receiving and partially enveloping an integrated circuit, e.g. an integrated circuit as shown in FIGS. 1 and 2.

The recesses 34 include sub-recesses 36 for surrounding extended portions of an integrated circuit such as the projections P of the integrated circuit IC shown in FIG. 1. Side walls 38 of the recesses 34 are configured to correspond to exterior side surfaces of the integrated circuits, e.g. the non-uniform side walls S of the integrated circuit IC shown in FIG. 2, so that the contact area of the body 32 on the integrated circuits is maximized. The configuration of the side walls 38 is also, preferably, designed so that the side walls 38 contact integrated circuit leads (e.g. leads L, FIG. 2) along a substantial portion of their length, thus enhancing the conduction of heat away from the leads. It is also preferred that the member 30 contact a portion of the leads which rests on an underlying surface of a board or other substrate in embodiments with such leads.

Portions 40 of the body 32 extend between adjacent integrated circuits. A bottom surface 42 of the body 32 is fashioned to correspond to the shape of a top surface of a printed circuit board or other substrate for conducting heat from circuits on the board and from the board itself.

FIG. 8 illustrates a heat conducting member 50 according to the present invention shown with a body 52 with a recess 54 partially enveloping an integrated circuit 55. A top surface 57, side surfaces 58, and leads 59 of the integrated circuit 55 are contacted by portions of the body 52. As shown, a substantial portion of the leads 59 which rest on a printed circuit board 51 are contacted by a part of the body 52. It is preferred that the body be configured to contact a substantial portion of the integrated circuit's top, sides, and leads, including a portion of the leads which rests on a printed circuit board. Thus, the body in this preferred embodiment is press-fittable over the integrated circuit and is removably held on the integrated circuit. Of course, it is within the scope of this invention for a member with more than one recess, e.g. the member shown in FIG. 4, to be press-fittable on and releasably held on a plurality (one or more) of integrated circuits.

Figure 9:
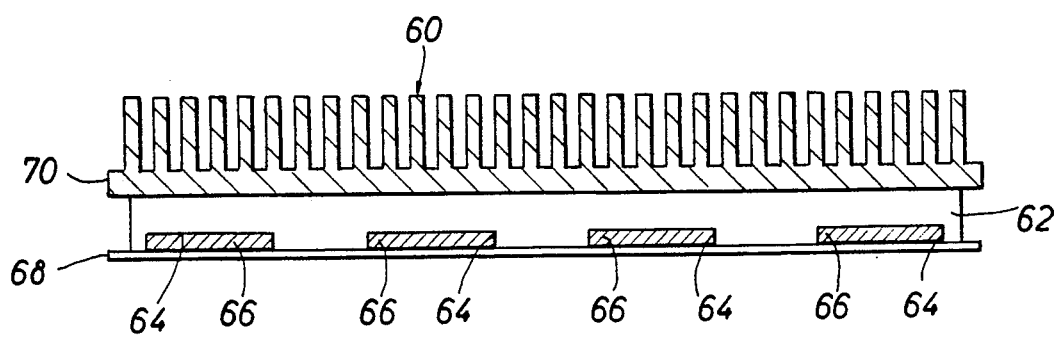
FIG. 9 is a side cross-sectional view of an insulation system according to the present invention.

FIG. 9 illustrates a system 60 according to the present invention which has a heat conducting body 62 with recesses 64 therein for enclosing a plurality of integrated circuits 66 mounted on a board 68. A finned metal heat sink 70 is disposed on top of the body 62 for facilitating the transfer of heat away from the integrated circuits.

In conclusion, therefore, it is seen that the present invention and the embodiments disclosed herein are well adapted to carry out the objectives and obtain the ends set forth at the outset. Certain changes can be made in the method and apparatus without departing from the spirit and the scope of this invention. It is realized that changes are possible and it is further intended that each element or step recited in any of the following claims is to be understood as referring to all equivalent elements or steps for accomplishing substantially the same results in substantially the same or equivalent manner. It is intended to cover the invention broadly in whatever form its principles may be utilized. The present invention is, therefore, well adapted to carry out the objects and obtain the ends and advantages mentioned, as well as others inherent therein.

We claim:

1. Apparatus adapted for use with an integrated circuit body having an exterior surface including top and side surfaces and metal leads from the integrated circuit body extending generally adjacent to the sides of the integrated circuit body, the metal leads being electrically connected to a printed circuit board, the apparatus comprising, a cooling member body made from a flexible, thermally conductive material removably press-fittable over the integrated circuit body, said cooling member body having a recess therein for receiving and enveloping the integrated circuit body, and said recess defined by walls configured to contact the top and side surfaces of the integrated circuit body and the metal leads extending from the integrated circuit body including a substantial length of the portion of the leads which are electrically connected to the printed circuit board.

2. Apparatus of claim 1 further comprising each metal lead having a length defined from the integrated circuit body to the end of the metal lead wherein the cooling member body is configured to contact each metal lead along substantially the entire length thereof.

3. Apparatus of claim 1 further comprising the integrated circuit body having projections and the cooling member body having subrecesses therein, wherein the integrated circuit body projections are received within the cooling member body subrecesses.

4. A cooling member adapted for use with a plurality of integrated circuit bodies, each integrated circuit body having an exterior surface including top and side surfaces and metal leads from the integrated circuit body extending generally adjacent to the sides of each integrated circuit body, the metal leads of each integrated circuit body being electrically connected to a printed circuit board, the cooling member comprising a cooling member body made from a flexible, thermally conductive material removably press-fittable over each integrated circuit body, said cooling member body having a plurality of recesses for receiving and enveloping the integrated circuit bodies, and each recess defined by walls configured to contact the top and side surfaces of the respective integrated circuit body and the metal leads extending from the respective integrated circuit body including a substantial length of the portion of the leads which are electrically connected to the printed circuit board.

5. The cooling member of claim 4 further comprising each metal lead having a length defined from the integrated circuit body to the end of the metal lead wherein the cooling member body contacts each metal lead along substantially the entire length thereof.

6. The cooling member of claim 4 further comprising a bottom insulating member, the printed circuit board positioned on the bottom insulating member.

7. The cooling member of claim 6 wherein the bottom insulating member is made from a flexible, thermally conductive material.

8. Apparatus adapted for use with an integrated circuit body having a generally rectangular shaped exterior surface including a top and side surfaces and metal leads extending therefrom, the metal leads being electrically connected to a printed circuit board, the apparatus comprising, a flexible, thermally conductive cooling member body being removably press-fittable over the integrated circuit body, said cooling member body having a recess therein, and said recess configured to a generally rectangular shape and defined by walls sized to contact the top and side surfaces of the integrated circuit body and the metal leads extending from the integrated circuit body including a substantial length of the portion of the leads which are selectively connected to the printed circuit board.

9. Apparatus of claim 8 further comprising each metal lead having a length defined from the integrated circuit body to the end of the metal lead wherein the cooling member body is configured to contact each metal along substantially the entire length thereof.

10. Apparatus of claim 8 further comprising the integrated circuit body having four corners and having projections protruding from the four corners and the cooling member body having subrecesses therein, wherein the integrated circuit body projections are received within the cooling member body subrecesses.

* * * * *